United States Patent [19]

Osaka et al.

[11] Patent Number: 4,481,523
[45] Date of Patent: Nov. 6, 1984

[54] AVALANCHE PHOTODIODES

[75] Inventors: Fukunobu Osaka; Tatsunori Shirai, both of Yokohama, Japan

[73] Assignee: Fujitsu Limited, Kawasaki, Japan

[21] Appl. No.: 326,119

[22] Filed: Nov. 30, 1981

[30] Foreign Application Priority Data

Dec. 2, 1980 [JP] Japan .................................. 55-169889

[51] Int. Cl.³ ............................................. H01L 27/14
[52] U.S. Cl. ........................................ 357/30; 357/13; 357/16
[58] Field of Search .............................. 357/13, 16, 30

[56] References Cited

U.S. PATENT DOCUMENTS

| | | | |
|---|---|---|---|
| 3,821,777 | 6/1974 | James ..................................... | 357/13 |
| 4,213,138 | 7/1980 | Campbell et al. ...................... | 357/30 |
| 4,231,049 | 10/1980 | Pearsall ................................. | 357/13 |
| 4,233,090 | 11/1980 | Hawrylo et al. ....................... | 357/16 |

FOREIGN PATENT DOCUMENTS

| | | | |
|---|---|---|---|
| 54-124991 | 9/1979 | Japan ..................................... | 357/16 |
| 55-72084 | 5/1980 | Japan ..................................... | 357/30 A |
| 56-54080 | 5/1981 | Japan ..................................... | 357/13 R |

OTHER PUBLICATIONS

Law et al., *Appl. Phys. Lett.*, 33(11), Dec. 1, 1978, pp. 920–921.

Matsushima et al., *Jpn. J. Appl. Phys.*, vol. 19, Mar. 1980, No. 3, pp. 573–574.

Iga et al., *IEEE Trans. on Elec. Devices*, vol. ED-26, No. 8, Aug. 8, 1979, pp. 1227–1228.

Donnelly et al., *Appl. Phys. Lett.*, (USA), Jul. 1, 1979, pp. 74–76.

Electronics Letters, "InP/InGaAsP Avalanche Photodiodes With New Guard Ring Structure", Osaka et al., vol. 16, No. 18, Aug. 1980, pp. 716–717.

IEEE Transactions on Electron Devices, "Guarded Avalanche Photodiodes in InP Fabricated by a Double Ion Implantation Technique", vol. ED-26, No. 11, 11/79.

Applied Physics Letters, "InGaAsP Heterostructure Avalanche Photodiodes With High Avalanche Gain", by Nishida et al., vol. 35, No. 3, Aug. 1979, pp. 251–253.

Electronics Letters, "InP-InGaAsP Planar Avalanche Photodiodes With Self-Guard-Ring Effect", by Taguchi et al., vol. 15, No. 5, Jul. 1979, pp. 453–455.

Electronics Letters, "1.3 μm InP/InGaAsP Planar Avalanche Photodiodes", by Shirai et al., vol. 17, No. 22, Oct. 1981, pp. 826–827.

*Primary Examiner*—Martin H. Edlow
*Assistant Examiner*—Terri M. Henn
*Attorney, Agent, or Firm*—Staas & Halsey

[57] ABSTRACT

An avalanche photodiode sensitive to a wavelength range of from 1.2 to 1.65 micrometers is provided with a light absorbing layer, a middle layer and an active layer grown in order, on a substrate. All the layers contain impurities with the same conductivity but the impurity concentration is higher in the middle layer than in either of the light absorbing layer and the active layer. A p-n junction having a flat bottom and either a gradually inclined side or a step-shaped side is produced in the active layer, so that the breakdown voltage is made much less in the area facing the flat bottom of the p-n junction than in the area facing a side which has the aforementioned irregular shape. As a result, the side acts as a guard ring without being accompanied by a large amount of tunnel current flowing through the light absorbing layer in response to the intensity of the electric field. An alternative avalanche photodiode includes a light absorbing layer, an active layer and a surface layer grown in this order and having a well shaped p-n junction which penetrates the interface between the surface layer and the active layer to spread along the same interface in the active layer. Since the impurity concentration of the surface layer is extremely marginal, performance characteristics similar to those mentioned above are realized.

14 Claims, 11 Drawing Figures

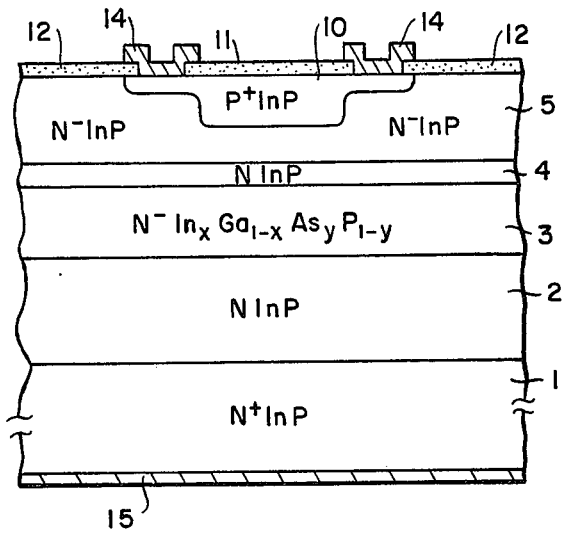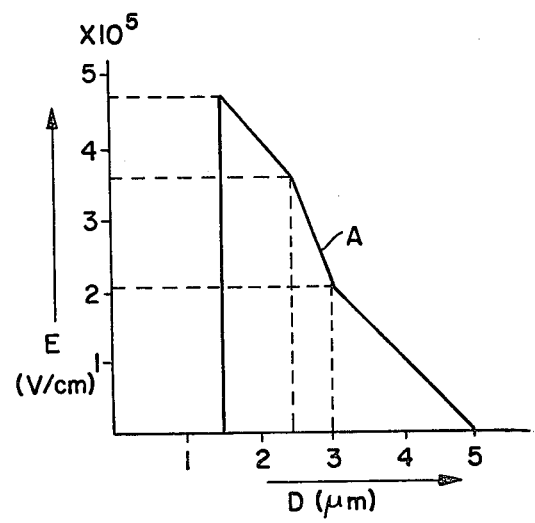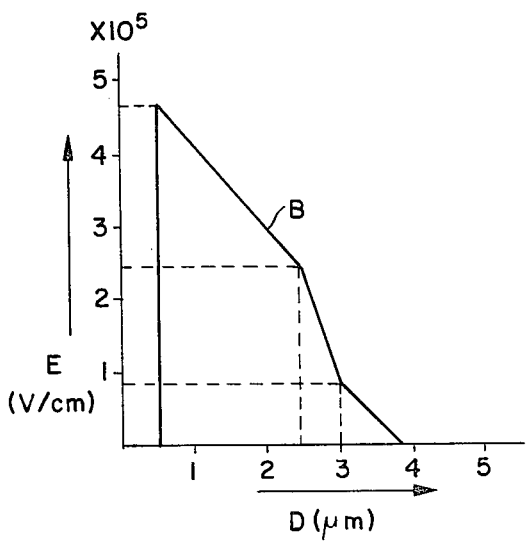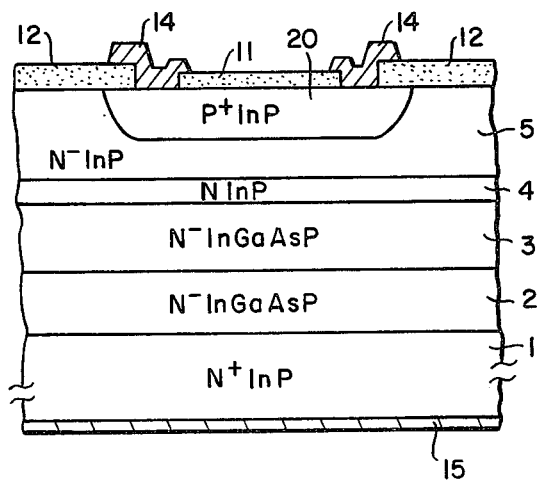

AVALANCHE PHOTODIODES

BACKGROUND OF THE INVENTION

This invention relates to an improvement applicable to an avalanche photodiode (Hereinafter referred to as an APD), specifically, a multilayered ADP having a sensitivity in the wavelength range from 1.2 through 1.65 micrometers and having a light absorbing layer made of a III–V group compound or alloy semiconductor, such as, $In_xGa_{1-x}As_{1-y}P_y$, GaSb et al. and a multiplication layer made of a III–V group compound or alloy semiconductor, such as, InP, $Ga_{1-x}Al_xSb$ et al. More specifically, this invention relates to an improved guard ring configuration thereof having a more reliable grade of performance and allowing the APD to be of the planar type.

An ADP is a type of photodiode which has various characteristics of improved performance, such as, higher grades of sensitivity and response time and lower values of dark-current and noise. These improved performance characteristics are realized by the avalanche breakdown phenomenon which occurs at a p-n junction arranged in a multiplication layer and applied with a reverse bias to cause the avalanche multiplication of the current of electrons and/or holes generated in a light absorbing region exposed to the light which has arrived at the light absorbing region. In order to realize these improved performance characteristics, it is required to allow breakdown to occur exclusively and uniformly in the central region of the diode where the light is absorbed. Therefore, APD's require some means which is effective to limit breakdown to the central region of the p-n junction.

The wavelength of light to which an APD is sensitive is determined by the amount of band gap Eg of the material with which the light absorbing layer thereof is made. In order to produce an APD sensitive to a longer wavelength of light, a layer combination of semiconductor, one of which has a relatively small amount of band gap Eg (to make itself a light abosorbing layer) and the other of which has a relatively large amount of band gap Eg (to make itself a multiplication layer), is used. For production of an APD sensitive to the light wavelength range of 1.2 through 1.65 micrometers, the combination of $In_xGa_{1-x}As_{1-y}P_y$ and InP and the combination of GaSb and $Ga_xAl_{1-x}Sb$ are preferably employed.

Therefore, the APD's which are multilayered, employing the above referred III–V group compound or alloy semiconductors, and which are publicly known in the prior art, have the so-called self guard ring layer configuration, in which a p-n junction is formed. This p-n junction is formed for the purpose of the avalanche multiplication slightly above the heterojunction between the light absorbing layer of InGaAs, InGaAsP or the like and the multiplication layer of InP or the like, so that electric field intensity in the light absorbing layer becomes larger in the central region of the diode or the light-absorbed region than in the other region or the region which is not exposed to light. This causes the breakdown voltage of the p-n junction to become less in the central region of the diode which is exposed to light than in the region which is not exposed to light, thereby realizing the guard ring effect. The function of the so-called self guard ring configuration is based on the characteristic that the band gap Eg, of the III–V group compound or alloy semiconductor with which the light absorbing layer is made, is less than the band gap Eg of the III–V group compound or alloy semiconductor with which the active layer is made and that the breakdown voltage is less for the former than for the latter. It is publicly acknowledged that this so-called self guard ring configuration provides an excellent guard ring effect.

The inventors of the invention have, however, discovered that the APD's having the so-called self guard ring configuration involve a drawback described below. Since the electric field intensity is necessarily high in the light absorbing layer the tunnel current or the current component caused by the carriers directly excited by the high magnitude of electric field intensity inevitably occurs in this region, thereby causing various adverse effects e.g. large amounts of dark current, noise or the like. It is well-known that the magnitude of the tunnel effect is larger for a substance having a low band gap Eg, such as, the III–V group compound or alloy semiconductor e.g. InGaAsP, GaSb and the like. Incidentally, it is well-known that the fundamental absorption edge λ is determined by an equality $\lambda = hc/Eg$. In view of the fact that the signal transmission loss in an optical fiber is less for longer wavelength light and that APD's sensitive to longer wavelength light or APD's having a light absorbing layer made of a material having a low band gap Eg are increasingly preferable, the above-described drawback due to the large amount of tunnel current, which is inherent to APD's having the so-called self guard ring layer configuration, is significant.

SUMMARY OF THE INVENTION

A first object of this invention is to provide an APD sensitive to light having a wavelength in the range of from 1.2 to 1.65 micrometers, which is provided with a light absorbing layer made of one of the III–V group compound or alloy semiconductors and with a multiplication layer made of the other of the III–V group compound or alloy semiconductors having a larger band gap Eg than that of the material of the light absorbing layer, wherein an improved guard ring configuration provides a planar type APD and which readily realizes an efficient guard ring effect without being accompanied by the above-described tunnel current problem, thereby realizing higher grades of avalanche-gain, sensitivity and response time, with lower values of dark-current and noise.

A second object of this invention is to provide a planar type APD satisfying the above-described first object, wherein a more efficient guard ring effect is realized or a more distinct difference in the breakdown voltage in the central region of the p-n junction and in the other region is realized.

A third object of this invention is to provide a planar type APD satisfying the above-described first and/or second objects with a simpler layer configuration, in which the quantity of the essential design parameters is reduced from three (3) to two (2) for the purpose of allowing a considerable degree of freedom for design and production of the APD.

To achieve the foregoing first object of this invention, an APD in accordance with this invention is provided with (a) a light absorbing layer made of one of the III–V group compound or alloy semiconductors, such as $In_xGa_{1-x}As_yP_{1-y}$, GaSb or the like, containing one or some impurities with one conductivity preferably in a relatively low concentration; (b) a thin layer (hereinafter referred to as a middle layer) with a thickness of 0.5 micrometers or less made of a material which allows lattice matching for itself with the light absorbing layer and has a larger band gap Eg than that of the semiconductor forming the light absorbing layer, the middle layer being preferably one of the III–V group compound or alloy semiconductors, such as InP when $In_x$-$Ga_{1-x}As_yP_{1-y}$ forms the light absorbing layer, $Ga_x$-$Al_{1-x}Sb$ when GaSb forms light absorbing layer or the like, the middle layer containing one or some impurities with a conductivity identical to that of the light absorbing layer preferably in a concentration greater than or equal to that of the light absorbing layer, the middle layer being grown on the light absorbing layer; and (c) an active layer with a relatively large thickness, e.g. 4 to 5 micrometers, made of a material which allows lattice matching for itself with the middle layer and which has a larger band gap Eg than that of the semiconductor forming the light absorbing layer, the active layer preferably being a III–V group compound or alloy semiconductor substantially identical to that of the middle layer, the active layer primarily containing one or more impurities with a conductivity identical to that of the middle layer in a concentration which is several tenths that of the middle layer, the active layer being grown on the middle layer and having a light sensitive region which contains one or more impurities with a conductivity different from that of the middle layer in a high concentration, e.g. approximately $10^{18}/cm^3$, the light sensitive region being separated from the other region of the active layer by a p-n junction having a gradually inclined side thereof surrounding the light sensitive region, the position of the p-n junction being in the neighborhood of the interface between the middle layer and the active layer.

The specific performance features realized by the above presented configuration of an APD is itemized below:

1. The breakdown voltage is higher for the gradually inclined side of the p-n junction than for the flat bottom of the p-n junction, thereby allowing preferential breakdown for the region exposed to light. As a result, an effective guard ring effect is realized.

2. The middle layer containing impurities in a relatively high concentration considerably decreases the electric field intensity in the light absorbing layer, thereby decreasing the magnitude of tunnel current to a marginal extent in comparison with the other components of dark-current.

3. The low magnitude of impurity concentration contained in the active layer decreases the electric field intensity, even at a time when a breakdown occurs, thereby increasing the ratio of ionization coefficients of electrons to holes.

4. The APD can be of a planar type.

It is noted that the above configuration became possible, when the inventors of this invention discovered that an InP epitaxial layer containing n-impurity in a concentration as low as $1 \times 10^{15}/cm^3$ can grow employing the unintentional doping liquid phase epitaxial process concurrently accompanied by the compensation of a p-type impurity.

To achieve the foregoing second object of this invention, an APD in accordance with this invention is provided with (a) a light absorbing layer identical to that described above, (b) a middle layer identical to that described above, and (c) an active layer substantially identical to that described above, however, the active layer having a relatively deep region forming a light sensitive region which contains one or more impurities with a conductivity different from that of the high concentration layer e.g. approximately $10^{18}/cm^3$, and the active layer having a relatively shallow region forming a guard ring surrounding the light sensitive region and containing one or more impurities with a conductivity identical to that of the light sensitive region in a high concentration identical to that of the light sensitive region. The light sensitive region and the guard ring region are separated from the other region of the active layer by a p-n junction having an abruptly vertical side thereof surrounding the light sensitive region and continuing to the shallow flat guard ring region.

The specific performance realized by the above configuration of an APD is, in addition to those presented above, a more distinct difference in the breakdown voltage in the light sensitive region and in the guard ring region, resulting in a more reliable guard ring effect.

To achieve the foregoing third object of this invention, an APD in accordance with this invention is provided with (a) a light absorbing layer identical to that described above; (b) an active layer with a relatively large thickness, e.g. 2 through 3 micrometers, made of a material which allows lattice matching for itself with the light absorbing layer and which has a larger band gap Eg than that of the semiconductor forming the light absorbing layer, the active layer preferably being one of the III–V group compound or alloy semiconductors, such as InP in the case of $In_xGa_{1-x}As_yP_{1-y}$, $Ga_x$-$Al_{1-x}Sb$ in the case of GaSb or the like, primarily containing one or more impurities with a conductivity identical to that of the light absorbing layer in a concentration greater than or equal to the light absorbing layer; the active layer being grown on the light absrobing layer; and (c) a surface layer made of a material which allows lattice matching for itself with the active layer and which has a larger band gap Eg than that of the semiconductor forming the light absorbing layer, the surface layer preferably being a III–V group compound or alloy semiconductor substantially identical to that of the middle layer, the surface layer primarily containing one or more impurities with a conductivity identical to that of the light absorbing layer in a concentration which is several tenths of that of the active layer or less, e.g. $1 \times 10^{15}/cm^3$, the surface layer and an upper portion of the active layer having a region which forms a light sensitive region and which contains one or more impurities with a conductivity different from that for these layers in a high concentration e.g. approximately $10^{18}/cm^3$, the light sensitive region being separated from the other region of the active layer and the surface layer by a p-n junction which vertically penetrates the surface region and horizontally takes place in the active layer.

The specific performance realized by this configuration of an APD is a s follows:

For production of APD's in accordance with this invention to the extent presented above, precise regulation is required for three (3) independent parameters including (a) the carrier concentration of the active layer, (b) the carrier concentration of the middle layer, and (c) the distance between the p-n junction and the interface front between the active layer and the middle layer. Further, attention must be paid to the magnitude of the curvature of the p-n junction in order to prevent a high magnitude electric field intensity at curved portions of the p-n junction. Due to these reasons, it is not necessarily easy to completely satisfy the design requirements. In the embodiment presented above, the quantity of the parameters to be regulated is decreased to two (2) and the layer configuration is considerably simplified, thereby allowing a considerable degree of freedom for design and production.

BRIEF DESCRIPTION OF THE DRAWINGS

Our invention, together with its various features and advantages, can be readily understood from the following more detailed description presented in conjunction with the following drawings, in which:

FIG. 5 is a diagram of a layer configuration of a wafer for an APD in accordance with the second embodiment of this invention showing the state of the wafer after the eleventh and final manufacturing step;

FIG. 6 is a graph of the electric field intensity vs. the downward distance from the p-n junction in the light sensitive region of an APD for the layer configuration shown in FIG. 5;

FIG. 7 is a graph, corresponding to FIG. 6 of the electric field intensity vs. the position in the guard ring region;

FIG. 8 is a diagram of a layer configuration of a finished wafer for an APD in accordance with a first embodiment satisfying the first object showing the finished position;

DETAILED DESCRIPTION OF THE PREFERRED EMBODIMENTS

Among the three (3) independent embodiments presented above satisfying each of the three (3) objects, the embodiment satifying the second object is most exemplary, accordingly, the second embodiment will be described first followed by the description of the first and third embodiments.

For simplicity's sake, the following description will be made for APD's in accordance with the first and second embodiments of this invention provided with an n-InP substrate, an n-InP buffer, and n-In$_x$Ga$_{1-x}$-As$_y$P$_{1-y}$ light absorbing layer, an n-InP middle layer and an n-InP active layer. A limited region of the active layer is deeply doped with a p-type impurity to form a light sensitive region which is surrounded by a shallow p-doped region forming a guard ring. The steps for production of the layer configuration is assumed to be continuously grown employing the liquid phase epitaxy in one process. Needless to say, lattice matching between each adjacent layer is absolutely essential.

Figure 1:
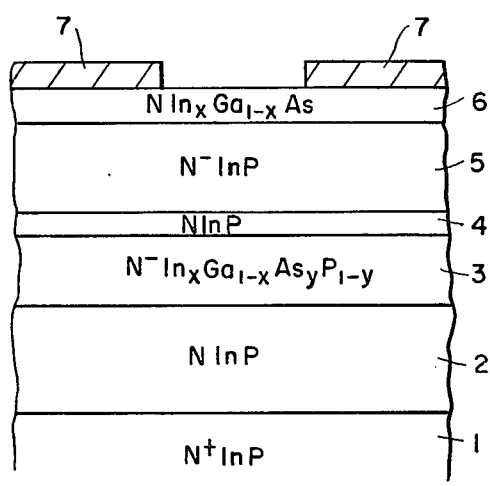
FIG. 1 is a diagram of layer configuration of a wafer for an APD in accordance with a second embodiment of this invention which satisfies the second object, showing the state of the wafer after the completion of the sixth manufacturing step.

Referring to FIG. 1, the first step is to grow an n-InP buffer layer 2 with a thickness of several micrometers and with an n-impurity concentration of approximately $10^{16}$/cm$^3$ on an n-InP single crystal substrate 1 with an n-concentration of approximately $10^{18}$/cm$^3$. Since the purpose of this step is simply to improve the crystal condition or the surface condition, this step is not an essential step for this invention but only a preferable step. Therefore, the technical signficance of the above-described amount of impurity concentration or layer thickness is rather limited.

The second step is to grow an n-In$_x$Ga$_{1-x}$As$_y$P$_{1-y}$ light absorbing layer 3 with a thickness of 2 micrometers or more and with an n-impurity concentration of from $5\times10^{15}$ to $1\times10^{16}$/cm$^3$ on the substrate 1 or preferably on the buffer layer 2.

The third step is to grow an n-InP middle layer 4 with a thickness of 0.5 micrometers or less and with an n-impurity concentration greater than or equal to the of the light absorbing layer 3, preferably greater than $2\times10^{16}$/cm$^3$, on the light absorbing layer 3.

The fourth step is to grow an n-InP active layer 5 with a thickness of approximately 2.5 micrometers and with an n-impurity concentration which is several tenths that of the middle layer 4 or less, preferably from $5\times10^{15}$ to $1\times10^{16}$/cm$^3$, on the middle layer 4.

Figure 3:
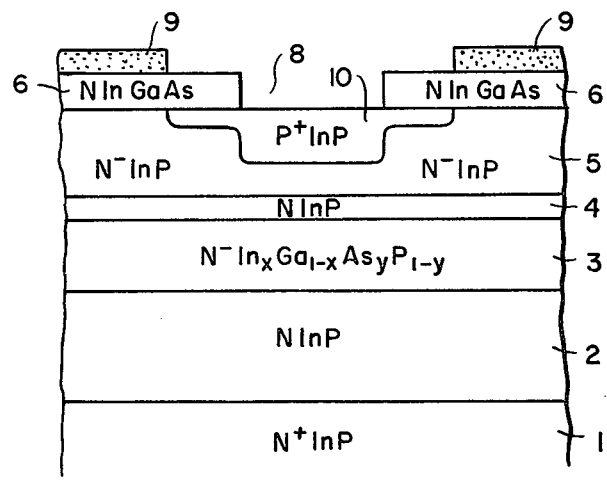
FIG. 3 is a diagram of a layer configuration of a wafer for an APD in accordance with the second embodiment of this invention showing the state of the wafer after the completion of the ninth manufacturing step.

The fifth step is to grow an n-In$_x$Ga$_{1-x}$As layer (hereinafter referred to as a mask layer) 6 on the active layer 5. This mask layer 6 is scheduled to act as a mask during the following etching and diffusion processes for the final purpose of producing a step shaped p-n junction as shown in FIG. 3. Therefore, an arbitrary magnitude of n-type impurity concentration is allowed, unless it causes any adverse effect on the impurity concentration of the active layer 5, during the following diffusion processes. As described earlier, the foregoing 5 steps are carried out in one process employing the liquid phase epitaxy.

The sixth step is to produce a resist photomask 7 which is resistive against sulfuric acid-based solvents on the mask layer 6 excluding on the light sensitive region thereof.

Figure 2:
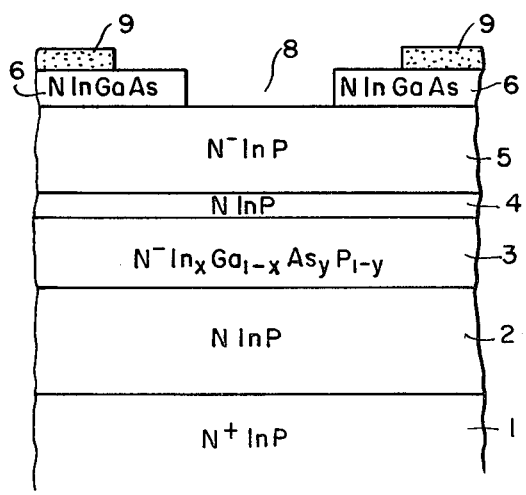
FIG. 2 is a diagram of a layer configuration of a wafer for an APD in accordance with the second embodiment of this invention, showing the state of the wafer after the completion of the eighth manufacturing step.

Referring to FIG. 2, the seventh step is to selectively remove the unmasked portion of the mask layer 6 employing the resist photomask 7. A convenient process for this step is to soak the wafer in a solution containing three parts sulfuric acid, one part hydrogen peroxide and one part water, because this solution dissolves In$_x$-Ga$_{1-x}$As but does not dissolve InP.

The eighth step is to remove the resist photomask 7, before a silicon dioxide layer is grown on the wafer, specifically on the mask layer 6 and partly on the active layer 5. Then photolithography is employed to remove the silicon dioxide layer from the region corresponding to the light sensitive region and a guard ring region, for the purpose of producing a mask 9 having an opening 8 on the light sensitive region and the guard ring region.

Referring to FIG. 3, the ninth step is to employ an impurity diffusion process to introduce a p-type impurity to an upper portion 10 of the active layer 5 to a high concentration such as $10^{18}/cm^3$. Due to the stepped shaped of the double-layered mask 9 and 6, a p-n junction with the stepped shape is produced. In other words, the depth of the p-n junction is much greater in the area corresponding the light sensitive region than in the area corresponding to the guard ring region. This impurity diffusion process can be carried out at a temperature of 500° C. employing $CdP_2$ as the impurity source. In the case of this embodiment, the p-n junction comprises of a deep portion produced at a depth of 1.5 micrometers in the light sensitive region and a shallow portion which continues to the deep portion and is produced at a depth of 0.5 micrometers in the area corresponding to the guard ring region. Therefore, the deep portion of the p-n junction is located 1 micrometer above the interface between the active layer 5 and the middle layer 4, and the shallow portion or the guard ring is located 2 micrometers above the interface between the active layer 5 and the middle layer 4. In this embodiment, a two-hour period was required for the diffusion.

Another process described below can be employed for production of the foregoing step shaped p-n junction. In this process, a recess is produced by means of an etching process applied to the area corresponding to the light sensitive region on the top surface of the n-InP active layer 5, rather than using the mask made of the $SiO_2$ layer 9 and the n-$In_xGa_{1-x}As$ layer 6, before a p-type impurity is diffused. The advantage of this process is its simplicity and the reduced number of heating processes.

Figure 4:
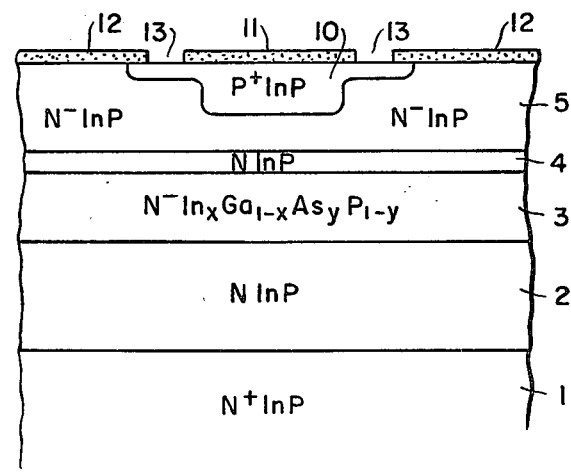
FIG. 4 is a diagram of a layer configuration of a wafer for an APD in accordance with the second embodiment of this invention showing the state of the wafer after the completion of the tenth manufacturing step.

Referring to FIG. 4, the tenth step is to remove the $SiO_2$ layer 9 and the n-$In_xGa_{1-x}As$ layer 6, both of which were in combination employed as a mask in the previous step, before producing an $SiO_2$ film 11 on the light sensitive region to allow the $SiO_2$ film 11 to act as an anti-reflection coat and another $SiO_2$ film 12 on the guard ring region and the region surrounding same to allow the $SiO_2$ film 12 to act as an insulator. The $SiO_2$ films 11 and 12 are separated from each other to leave an area 13 on which an anode is scheduled to be produced between the $SiO_2$ films 11 and 12. The removal of the $SiO_2$ layer 9 and the n-$In_xGa_{1-x}As$ layer 6 can be readily carried out by soaking the wafer respectively in a solution containing fluoric acid and ammonium fluoride and a sulfuric acid based solvent. The chemical vapour deposition and photo-lithography are in combination employed for production of the $SiO_2$ films 11 and 12.

Referring to FIG. 5, the eleventh step is to produce an anode 14 and a cathode 15 respectively on the area 13 and the bottom surface of the wafer. In this embodiment, the anode and the cathode are produced by means of the vacuum evaporation of AuZn and AuGe respectively.

When an APD is operated, the APD is applied with a negative voltage and a positive voltage respectively at the anode and the cathode. Since this voltage turns out to be the reverse bias for the p-n junction produced in an APD having a layer configuration as shown in FIG. 5, a depletion layer extends across the p-n junction. Within a depletion layer, the differential of intensity of electric field versus the distance from a p-n junction is proportional to the impurity concentration of the corresponding region. Therefore, in the case of the layer configuration shown in FIG. 5, the extension of the depletion layer is quite marginal toward the p+ side of the p-n junction, however, the depletion layer is inclined to extend far into the middle layer 4 and the light absorbing layer 3. Since the p-n junction is step shaped and the impurity concentration is non-uniform in the direction of depth, the magnitude of the extension of the depletion layer differs for the light sensitive region window and to the guard ring region. On the assumption that the n-type impurity concentration is $8 \times 10^{15}/cm^3$ for the active layer 5 and for the light absorbing layer 3 and is $2 \times 10^{16}/cm^3$ for the middle layer 4, the relationship between the intensity of electric field and the depth from the wafer surface is determined to be as shown in FIGS. 6 and 7. The polygonal line A, shown in FIG. 6, shows the position in which a breakdown happens in the light sensitive region and the polygonal line B, shown in FIG. 7, shows the position in which a breakdown happens in the guard ring region. In FIG. 6, the values of the intensity of electric field are $4.73 \times 10^5 V/cm$, $3.56 \times 10^5 V/cm$ and $2.10 \times 10^5 V/cm$, respectively, at the p-n junction, at the interface between the active layer 5 and the middle layer 4 and at the interface between the middle layer 4 and the light absorbing layer 3. In FIG. 7, the corresponding amounts are $4.73 \times 10^5 V/cm$, $2.39 \times 10^5 V/cm$ and $0.93 \times 10^5 V/cm$ respectively. In either figure, the area surrounded by the solid line A or B and the X-axis shows the breakdown voltage. FIG. 6 shows that the breakdown voltage in the light sensitive region is 75.6 V. FIG. 7 shows that the breakdown voltage in the area facing the guard ring is 90.2 V. Since a fairly large difference specifically 14.6 V is observed between the breakdown voltages for the light sensitive region and for the area facing the guard ring, an APD in accordance with an embodiment of this invention allows a breakdown to occur only in the light sensitive region, thereby satisfying one of the requirements of this invention.

As described above, the middle layer 4 interleaved between the active layer 5 and the light absorbing layer 3 has a relatively large band gap and contains impurities at a relatively high concentration. This middle layer 4 causes a large decrease in the intensity of the electric field, thereby decreasing the intensity of the electric field in the light absorbing layer 3. This limits the amount of tunnel current which may flow across this layer. In the case of this embodiment in which the values of the intensity of electric field are described above, the maximum amount of tunnel current which is to accompany a breakdown which occurs in response to the exposure to light having a wavelength of 1.35 micrometers or the fundamental absorption edge of $In_xGa_{1-x}As_yP_{1-y}$, is $8 \times 10^{-14}A$, on the assumption that the diameter of the light window is 100 micrometers. The corresponding amount in the case in which the APD is exposed to light having a wavelength of 1.65 micrometers is $3 \times 10^{-8}A$. Since the magnitude of tunnel current is much less than that of the dark current caused by the other parameters, the magnitude of the overall dark current is sufficiently decreased. As a result, the other requirement of this invention is also satisfied.

It is well-known that the excess noise coefficient decreases in dependence upon the ratio of ionization factors of holes to electrons. On the other hand, it is also well-known that the ionization factors of holes to electrons increase in proportion to the inverse number of the intensity of the electric field. In this embodiment, therefore, the impurity concentration of the active layer 5 is decreased in order to decrease the intensity of the electric field in the instance of a breakdown and, therefore, to increase the ratio of ionization factors of holes to electrons. Due to the latter parameters, the magnitude of the excess noise is decreased, thereby satisfying another of the requirements of this invention.

Just from FIG. 5, it is readily recognized that an APD in accordance with this embodiment is of the planar type. As described above, an APD in accordance with this embodiment entirely satisfies the second object of this invention.

Figure 9:
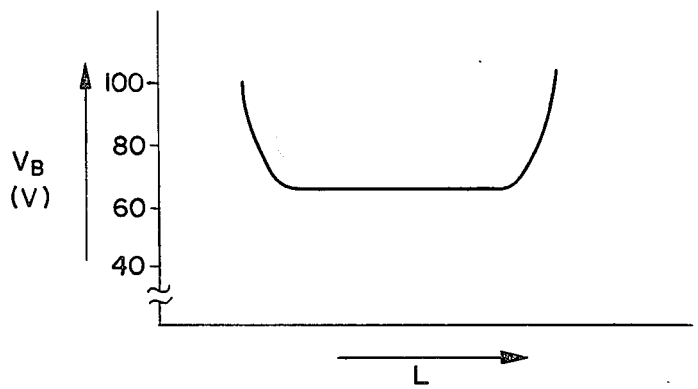
FIG. 9 is a graph of the breakdown voltage vs. horizontal position along the layers of an APD for the layer configuration shown in FIG. 8.

Referring to FIGS. 8 and 9, the first embodiment will be described below. As shown in FIG. 8 which is a diagram of a layer configuration of a wafer, the layer configuration of this first embodiment fairly resembles that of the aforegoing second embodiment. The major difference between the two are that the p-n junction is not step shaped but has a gradually inclined side which surrounds the light sensitive region and that the position of the p-n junction is in the neighborhood of the interface between the middle layer and the active layer. In other words, the p+-InP region 20 is not surrounded by a shallow guard ring region. The basic principle providing the guard ring effect is that combination of such a p-n junction, having a gradually inclined side and the middle layer 4 interleaved between the active layer 5 and the light absorbing layer 3, causes the breakdown voltage to be higher for a point remote from the middle layer 4, thereby allowing the side of the p-n junction to act as a guard ring.

Specifically referring to FIG. 8, the various parameters for the substrate 1, the buffer layer 2, the light absorbing layer 3 and the active layer 5 are entirely identical to those of the aforegoing APD in accordance with the second embodiment. The n-InP middle layer 4 has a thickness of 1 micrometers and an impurity concentration of $1\times 10^{16}/cm^3$. The depth of the p+-InP region 20 is 1.5 micrometers. The other parameters including the SiO$_2$ anti-reflection coat 11, the SiO$_2$ insulator film 12, the anode 14 and the cathode 15 are identical to those of the aforegoing APD in accordance with the second embodiment. The gradually inclined region 20 is formed, for example, by Beryllium (Be) ion implantation.

FIG. 9 is a graph of the distribution of the breakdown voltage along the top surface of the APD. The breakdown voltage is 66.5 V within the light sensitive region, gradually increasing to 99.4 V at the external edge of the p-n junction, thereby realizing the guard ring effect.

Although this first embodiment realizes a less distinct difference in the breakdown voltage, between the region facing the light window and the guard ring region, than that realized in the foregoing second embodiment, it is operative from a practical viewpoint. In addition, this first embodiment has the following advantages in comparison with the foregoing second embodiment.

1. No mask is required for production of a shallow portion of the p+-InP region, because the APD has no such a shallow portion.

2. No adverse effects which are inclined to be caused by a step shaped p-n junction are involved. In other words, in the case of a step shaped p-n junction, curvatures having lower radius of curvature of rather sharp curvatures are inevitably involved, resulting in less amounts of breakdown voltage at such sharp curvatures. In the case of this first embodiment, such an adverse effect does not occur.

It is needless to emphasize that an APD in accordance with this first embodiment of this invention also realizes various advantages realized by the foregoing second embodiment, such as a lower magnitude of dark current and excess noise, etc. As described above, an APD in accordance with this embodiment entirely satisfies the first object of this invention.

The device of this first embodiment, as shown in FIG. 8, may be advantageously modified to associate a low concentration p type guard ring region at the periphery of the light sensitive region to assure the guard ring effect. Such a low concentration guard ring region may be formed by, for example, ion-implantation of a p type impurity, particularly Beryllium.

Figure 10:
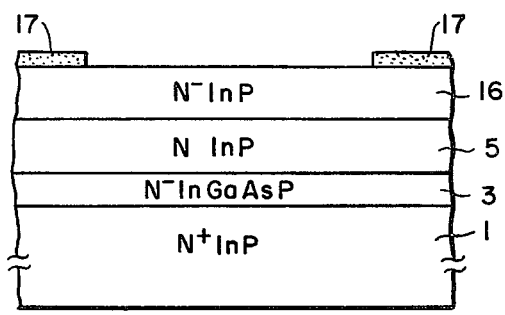
FIG. 10 is a diagram of a layer configuration of a wafer for an APD in accordance with a third embodiment satisfying the third object showing the state of the wafer after an intermediate manufacturing step.
Figure 11:
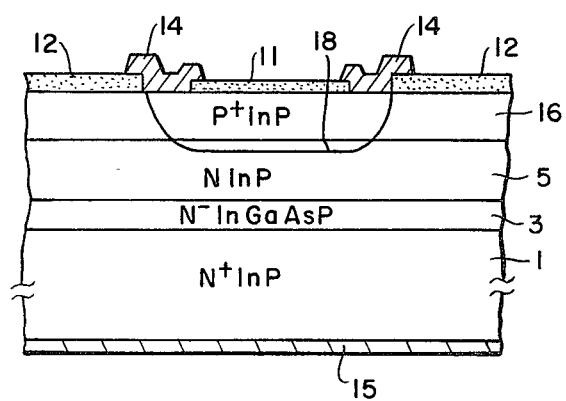
FIG. 11 is a diagram of a layer configuration of a finished wafer for an APD in accordance with the third embodiment of this invention.

Referring to FIGS. 10 and 11, the third embodiment of the present invention will be described below. As described earlier, the third object of this invention is to provide an APD which satisfies the first and second objects of this invention with a simpler layer configuration, and which is produced using a simpler method with a lesser quantity of parameters.

Specifically referring to FIG. 10, the liquid phase epitaxy is employed to grow an InP surface layer 16 having a thickness of approximately 4 through 5 micrometers and containing one or more n-type impurities in a concentration of approximately $1\times 10^{15}/cm^3$ on an InP active layer 5 having a thickness of approximately 4 through 5 micrometers and containing one or more n-type impurities in a concentration of approximately $5\times 10^{15}/cm^3$ on an In$_x$Ga$_{1-x}$As$_y$P$_{1-y}$ light absorbing layer 3 having a thickness of approximately 2 micrometers and containing one or more n-type impurities in a concentration of approximately $5\times 10^{15}/cm^3$ on an InP substrate 1 containing one or more n-type impurities in a concentration of approximately $10^{18}/cm^3$. During the period in which the InP surface layer 16 is grown primarily based on the unintentional doping bases, one or more p-type impurities are supplied to compensate the n-type impurities inherently contained in the source.

A chemical vapour deposition process is employed for producing a thin SiO$_2$ layer 17 on the InP surface 16, before the photolithography process is employed to remove the SiO$_2$ layer 17 from the area corresponding to the light window for the purpose of producing a diffusion mask.

Specifically referring to FIG. 11, one or more p-type impurities are diffused into the wafer in a concentration of approximately $10^{18}/cm^3$ employing the SiO$_2$ layer 17 as a mask for the purpose of producing a p-n junction 18 adjacent the interface between the n-InP surface layer 16 and the n-InP active layer 5 or at a deeper level.

After the SiO$_2$ layer 17 is removed, another SiO$_2$ film 11 is produced on the light window to allow the SiO$_2$ film 11 to act as an anti-reflection coat and the third SiO$_2$ film 12 is produced on the guard ring region and the region surrounding same. Such SiO$_2$ films 11 and 12 are separated from each other to leave an area on which an anode is produced. Thereafter, an anode 14 is produced on an area of the surface layer 16 surrounding the light window or the anti-reflection coat 11 confined by the insulator SiO$_2$ film 12 and a cathode 15 is produced on the rear surface of the wafer.

The major differences between the layer configurations of the foregoing first embodiment and this third embodiment are that the latter has no middle layer 4 and the location of the p-n junction is somewhat free, so that the parameter is virtually limited to the concentration of the active layer, although the location of the p-n junction has a physical significance to a considerable extent.

As described above, an APD in accordance with this third embodiment of this invention can be of a simpler layer configuration, satisfying the third object of this invention.

Although the invention has been described with reference to specific embodiments, this description is not meant to be construed in a limiting sense. Various modifications of the disclosed embodiments, as well as other embodiments of this invention, will become apparent to persons skilled in the art upon reference to the description of this invention. It is therefore contemplated that the appended claims will cover any such modifications or embodiments which fall within the true scope of this invention.

What is claimed is:

1. An avalanche photodiode comprising:
   a light absorbing semiconductor layer containing at least one impurity of a first conductivity type;
   a middle semiconductor layer formed on said light absorbing semiconductor layer and being lattice matched with said light absorbing semiconductor layer, said middle semiconductor layer having a larger band gap than said light absorbing semiconductor layer, said middle layer containing at least one impurity of said first conductivity type in a first concentration; and
   an active semiconductor layer formed on said middle semiconductor layer and being lattice matched with said middle semiconductor layer, said active semicondutor layer having a larger band gap than said light absorbing semiconductor layer, said active semiconductor layer containing at least one impurity of said first conductivity type in a second concentration less than said first concentration, said active semiconductor layer having a light sensitive region which contains at least one impurity of a second conductivity type different from said first conductivity type, said light sensitive region being separated from the other region of said active semiconductor layer by a p-n junction having gradually inclined side thereof surrounding said light sensitive region.

2. An avalanche photodiode comprising:
   a light absorbing semiconductor layer containing at least one impurity of a first conductivity type;
   a middle semiconductor layer formed on said light absorbing semiconductor layer and being lattice matched with said light absorbing semiconductor layer, said middle semiconductor layer having a larger band gap than said light absorbing semiconductor layer, said middle semiconductor layer containing at least one impurity of said first conductivity type in a first concentration; and
   an active semiconductor layer formed on said middle semiconductor layer and being lattice matched with said middle semiconductor layer, said active semiconductor layer having a larger band gap than said light absorbing semiconductor layer, said active semiconductor layer containing at least one impurity of said first conductivy type in a second concentration less than said first concentration, said active semiconductor layer having a light sensitive region which contains at least one impurity of a second conductivity type different from said first conductivity type, said light sensitive region being separated from the other region of said active semiconductor layer by a step shaped p-n junction having a deep area facing said light sensitive region and a continuous shallow area connected to said deep area by a steep side area so that said shallow area surrounds said deep area.

3. An avalanche photodiode comprising:
   a light absorbing semiconductor layer containing at least one impurity of a first conductivity type;
   an active semiconductor layer formed on said light absorbing semiconductor layer and being lattice matched with said light absorbing semiconductor layer, said active semiconductor layer having a larger band gap than said light absorbing semiconductor layer, said active semiconductor layer primarily containing at least one impurity of said first conductivity type in a first concentration;
   a surface semiconductor layer formed on said active semiconductor layer and being lattice matched with said active semiconductor layer, said surface semiconductor layer having a larger band gap than said light absorbing semiconductor layer, said surface semiconductor layer pimarily containing at least one impurity of said first conductivity type in a second concentration less than said first concentration, said surface semiconductor layer and an upper portion of said active semiconductor layer having a light sensitive region which contains at least one impurity of a second conductivity type different from said first conductivity type, said light sensitive region being separated from the other regions of said surface semiconductor layer and said active semiconductor layer by a well shaped p-n junction the bottom of which is formed in said active semiconductor layer.

4. An avalanche photodiode as set forth in claim 2, wherein said first concentration is greater than or equal to $2\times10^{16}/cm^3$ and wherein said second concentration is in the range of $5\times10^{15}/cm^3$ to $1\times10^{16}/cm^3$.

5. An avalache photodiode as set forth in claim 4, wherein said middle semiconductor layer has a thickness which is less than or equal to 0.5 micrometers and wherein said active semiconductor layer has a thickness of approximately 2.5 micrometers.

6. An avalanche photodiode as set forth in claim 5, wherein said middle semiconductor layer and said active semiconductor layer are formed of InP and wherein said at least one impurity in said light sensitive region is $CdP_2$.

7. An avalanche photodiode as set forth in claim 6, wherein said light sensitive region has a deep portion which is substantially 1.5 micrometers thick and a shallow portion which is substantially 0.5 micrometers thick.

8. An avalanche photodiode as set forth in claim 1, wherein said first concentration is substantially $1\times10^{16}/cm^3$ and wherein said second concentration is from $5\times10^{15}$ to $1\times10^{16}/cm^3$.

9. An avalanche photodiode as set forth in claim 8, wherein said middle semiconductor layer has a thickness of approximately 1 micrometer and wherein said active semiconductor layer has the thickness of approximately 2.5 micrometers.

10. An avalanche photodiode as set forth in claim 9, wherein said middle semiconductor layer and said active semiconductor layer are formed of InP.

11. An avalanche photodiode as set forth in claim 10, wherein said at least one impurity in said light sensitive region is Beryllium.

12. An avalanche photodiode as set forth in claim 3, wherein said first concentration is $5 \times 10^{15}/cm^3$ and wherein said second concentration is $1 \times 10^{15}/cm^3$.

13. An avalanche photodiode as set forth in claim 12, wherein said active semiconductor layer has a thickness of from 4 to 5 micrometers and wherein said surface semiconductor layer has a thickness of 4 to 5 micrometers.

14. An avalanche photodiode as set forth in claim 13, wherein said active semiconductor layer and said surface semiconductor layer are formed of InP.

* * * * *

UNITED STATES PATENT AND TRADEMARK OFFICE
CERTIFICATE OF CORRECTION

PATENT NO. : 4,481,523
DATED : NOVEMBER 6, 1984
INVENTOR(S) : FUKUNOBU OSAKA ET AL.

It is certified that error appears in the above-identified patent and that said Letters Patent is hereby corrected as shown below:

```
Col. 1, line  7, "ADP" should be --APD--;
        line  8, "range" should be --range of--;
        line 18, "ADP" should be --APD--;
        line 40, "ductor," should be --ductors,--;
        line 41, "abosorbing" should be --absorbing--.

Col. 4, line  5, "layer e.g." should be --layers, e.g.--;
        line 37, "absrobing" should be --absorbing--.

Col. 6, line 29, "to the" should be --to that--.

Col. 7, line  8, "corresponding" should be --corresponding
                  to--.

Col. 8, line  9, delete "to".

Col. 12, line 41, "avalache" should be --avalanche--.

Col. 13, line  3, "Beryllium" should be --beryllium--.
```

Signed and Sealed this

Tenth Day of September 1985

[SEAL]

Attest:

DONALD J. QUIGG

Attesting Officer        Acting Commissioner of Patents and Trademarks - Designate